United States Patent

Chang et al.

[11] Patent Number: 6,166,392
[45] Date of Patent: Dec. 26, 2000

[54] EXPOSURE FOR PERFORMING SYNCHRONIZED OFF-AXIS ALIGNMENT

[75] Inventors: Chih-Jen Chang, Hsinchu; Ming-Sung Wu, Feng-Hsan; Tseng-Lung Chen, Hsinchu, all of Taiwan

[73] Assignee: United Microelectronics Corp., Hsinchu, Taiwan

[21] Appl. No.: 09/193,220

[22] Filed: Nov. 16, 1998

[30] Foreign Application Priority Data

Aug. 18, 1998 [TW] Taiwan .................................. 87113548

[51] Int. Cl.[7] ...................................................... G01N 21/86
[52] U.S. Cl. ............................ 250/548; 355/53; 356/401
[58] Field of Search ............................... 250/548; 355/53, 355/55; 356/399–401, 356

[56] References Cited

U.S. PATENT DOCUMENTS

| | | | |
|---|---|---|---|
| 4,653,903 | 3/1987 | Torigoe et al. ........................... | 355/53 |
| 4,878,086 | 10/1989 | Isohata et al. ............................ | 355/53 |
| 5,227,839 | 7/1993 | Allen ........................................ | 355/53 |
| 5,923,403 | 7/1999 | Jain .......................................... | 355/53 |
| 5,959,271 | 9/1999 | Nishi ........................................ | 355/53 |
| 5,999,270 | 12/1999 | Mori et al. ............................... | 356/401 |

Primary Examiner—Stephone B. Allen
Attorney, Agent, or Firm—Hickman Coleman & Hughes, LLP

[57] ABSTRACT

An exposure has at least two wafer pads for holding wafers at the same time to perform different tasks including exposing a wafer, aligning a wafer, and loading or unloading a wafer synchronously. The exposure of the invention includes an exposing unit, a wafer supporting unit and a alignment beam scan unit. The wafer-supporting unit contains at least two wafer pads for holding wafers. The alignment beam scan unit contains an interferometer for detecting the interference patterns formed by the alignment beams and the alignment marks on the wafers. The tasks of aligning a wafer, and exposing a wafer, or loading/unloading a wafer can be performed on the wafers placed on each individual wafer pad synchronously.

11 Claims, 4 Drawing Sheets

EXPOSURE FOR PERFORMING SYNCHRONIZED OFF-AXIS ALIGNMENT

CROSS-REFERENCE TO RELATED APPLICATION

This application claims the priority benefit of Taiwan application serial no. 87113548, filed Aug. 18, 1998, the full disclosure of which is incorporated herein by reference.

BACKGROUND OF THE INVENTION

1. Field of the Invention

This invention relates to an exposure, and more particularly, to an exposure that performs an off-axis alignment synchronized with an exposing process.

2. Description of Related Art

The formation of a semiconductor device consists of various processes including deposition, exposing, etching and so on. Since most materials forming a semiconductor device need to be patterned in order to meet certain required layouts, the exposing process directly affects the quality and efficiency of the fabrication process of a semiconductor device. Before performing an exposing process, it is essential to align a wafer to ensure that a pattern is transferred on to desired location precisely. Generally, at least two alignment marks are formed on a wafer for the purpose of aligning the wafer.

The alignment and exposing process performed on a conventional exposure is shown in FIGS. 1A and 1B, wherein the conventional exposure basically contains a wafer stage 102 and a alignment beam scan unit 106. Referring to FIG. 1A, a wafer 101 is placed on a holding pad 104 of an adjustable wafer stage 102. There are two alignment marks (not shown in figure) formed on the wafer 101 for locating the wafer in two different directions respectively. Before performing an exposing process, the alignment beam scan unit 106, which is fixed still, emits two alignment beams 103 to strike on a mirror set 108, and then the alignment beams 103 are reflected on the wafer 101 in two different directions. By moving the wafer stage 102 in a certain path, the alignment beams 103 scan over different areas on the wafer 101 till the alignment marks on the wafer are found. By using an interferometer in the alignment bean scan unit 106 to check the alignment beams reflected back from the surface of the wafer 101, the position of the wafer 101 is correctly defined. Referring next to FIG. 1B, the wafer stage 102 moves to an exposing position, so that the aligned wafer 101 thereon is right under an exposing unit 100 of the exposure and is ready to be patterned.

Since a conventional exposure as described above can only support one wafer, that is, it is limited to perform either the exposing process or the alignment process at one time. Therefore, the conventional exposure is not efficient because either the exposing unit 100 or the alignment beam scan unit 106 is idle whenever the other unit is functioning. In addition, the time spent on loading and unloading a wafer also increases the process time of fabricating a semiconductor device.

SUMMARY OF THE INVENTION

It is therefore an objective of the present invention to provide exposure that is capable of performing an exposing process and an alignment process synchronously to shorten the process time of fabrication a semiconductor device to improve the yield.

In accordance with the foregoing and other objectives of the present invention, the invention provides an exposure that has at least two wafer pads for holding wafers at the same time. The exposure of the invention performs different tasks including exposing a wafer, aligning a wafer, and loading or unloading a wafer synchronously to be make the fabrication process more efficient. The exposure of the invention includes an exposing unit, a wafer supporting unit and a alignment beam scan unit. The wafer-supporting unit contains at least two wafer pads for holding wafers. The alignment beam scan unit contains an interferometer for detecting the interference patterns formed by the alignment beams and the alignment marks on the wafers. The tasks of aligning a wafer, and exposing a wafer, or loading/unloading a wafer can be performed on the wafers placed on each individual wafer pad synchronously.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a exposure shown in FIGS. 2A through 2E that is capable of shortening the fabrication process of a semiconductor device.

Figure 1A:
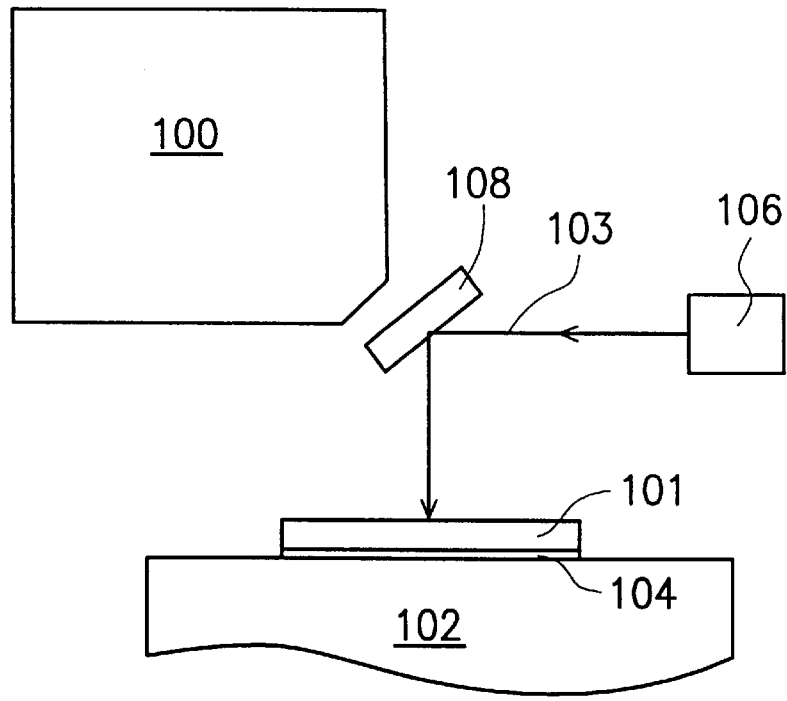
FIGS. 1A and 1B are schematic diagram showing the functions of a conventional exposure.
Figure 1B:
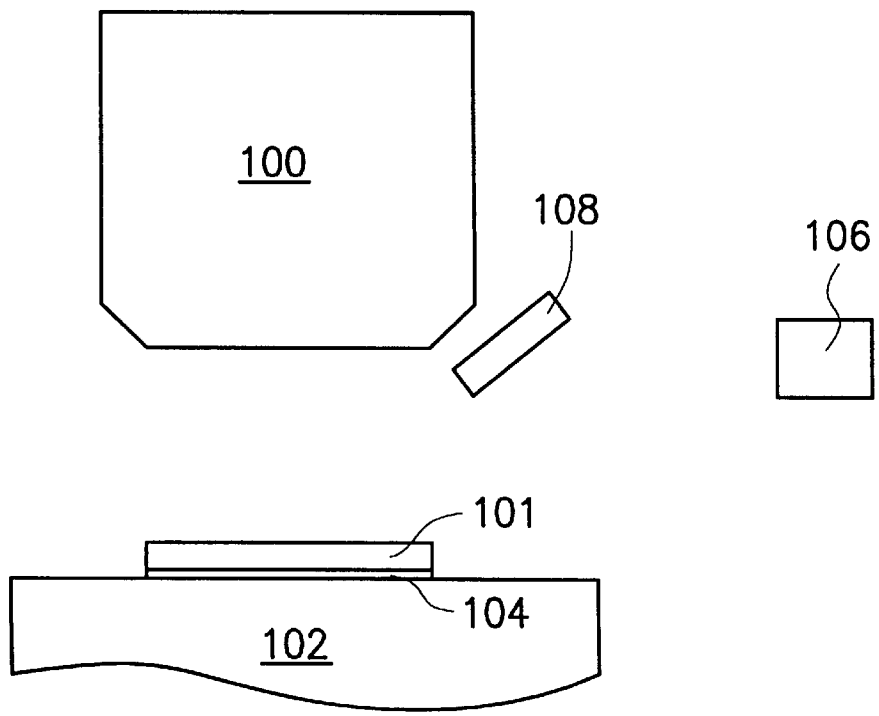
Figure 2A:
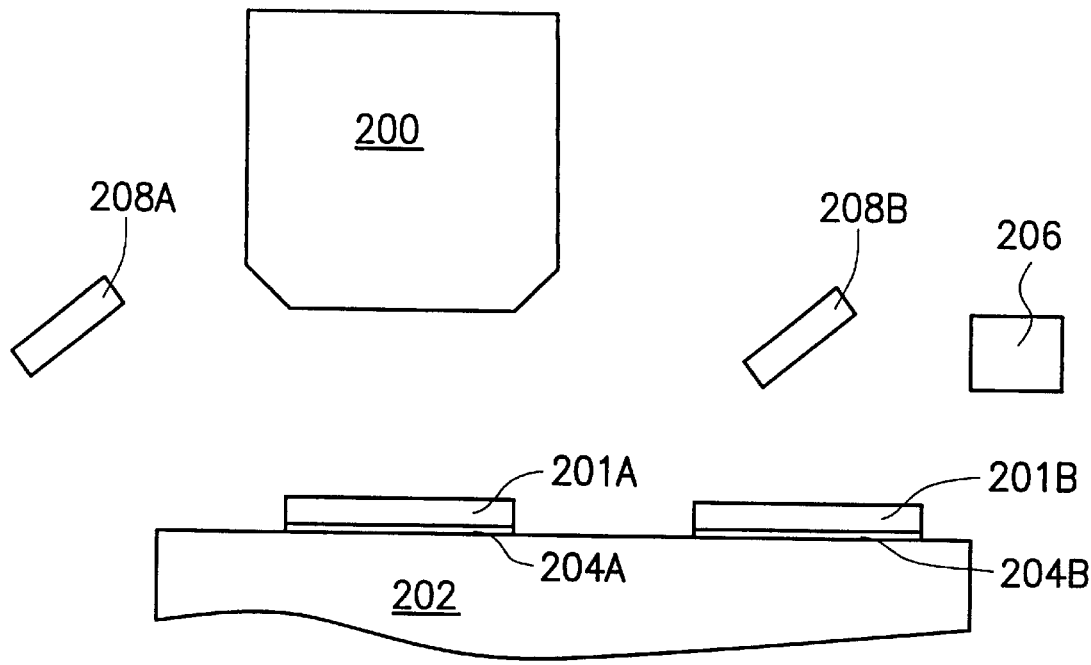
FIGS. 2A through 2E are schematic diagram showing the functions of an exposure of a preferred embodiment according to the invention.

Referring to FIG. 2A, the exposure of the invention contains an exposing unit 200, a wafer-supporting unit 202, and an alignment unit. The wafer-supporting unit 202 placed under the exposing unit 200 further contains at least two wafer pads, 204A and 204B, for holding wafers, 201A and 201B. One of the wafers, 201A and 201B, for example, the wafer 201A, is well aligned and located below the exposing unit 200 when the exposure of the invention is performing an alignment process. The alignment unit further contains an alignment beam scan unit 206, mirror sets 208A and 208B, and an interferometer (not shown in figure). Generally a valid alignment information for a wafer contains at least two scanned information obtained by using two alignment beams on two alignment marks. Therefore, there are at least two alignment marks (not shown in figure) formed on the top surfaces of wafers 201A and 201B respectively for defining the positions of wafers 201A and 201B from at least two different directions. The alignment beam scan unit 206 and the wafer-supporting unit 202 are both adjustable, and furthermore, the adjusting scales of the alignment beam scan unit 206 and the wafer-supporting unit 202 exactly the same.

Figure 2B:
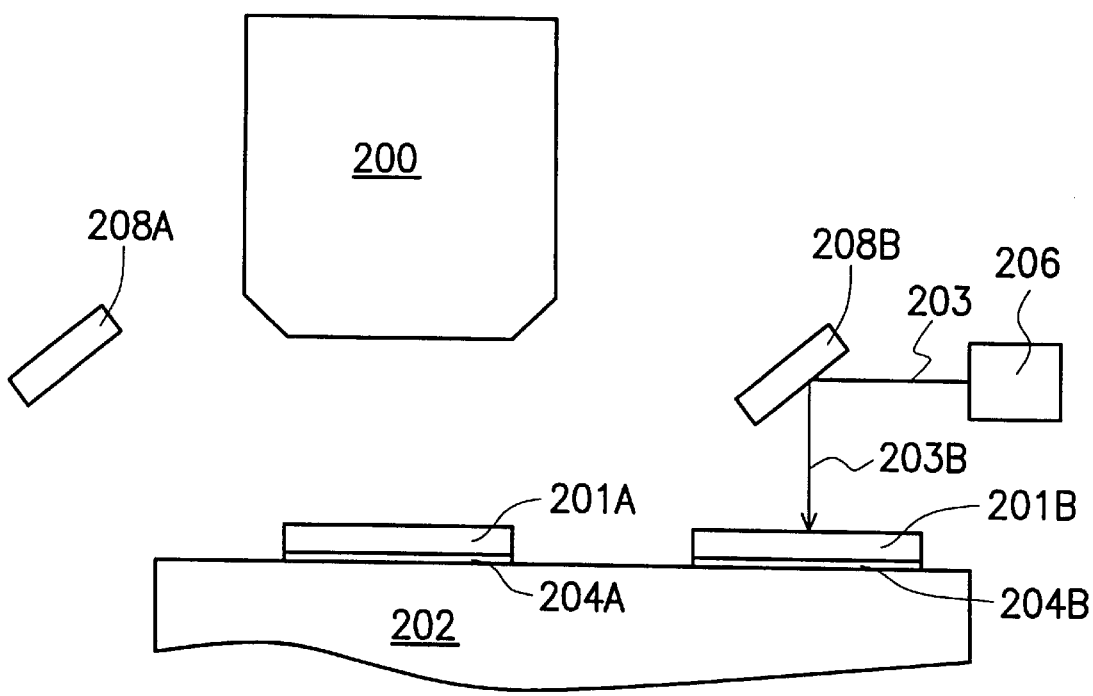
Figure 2C:
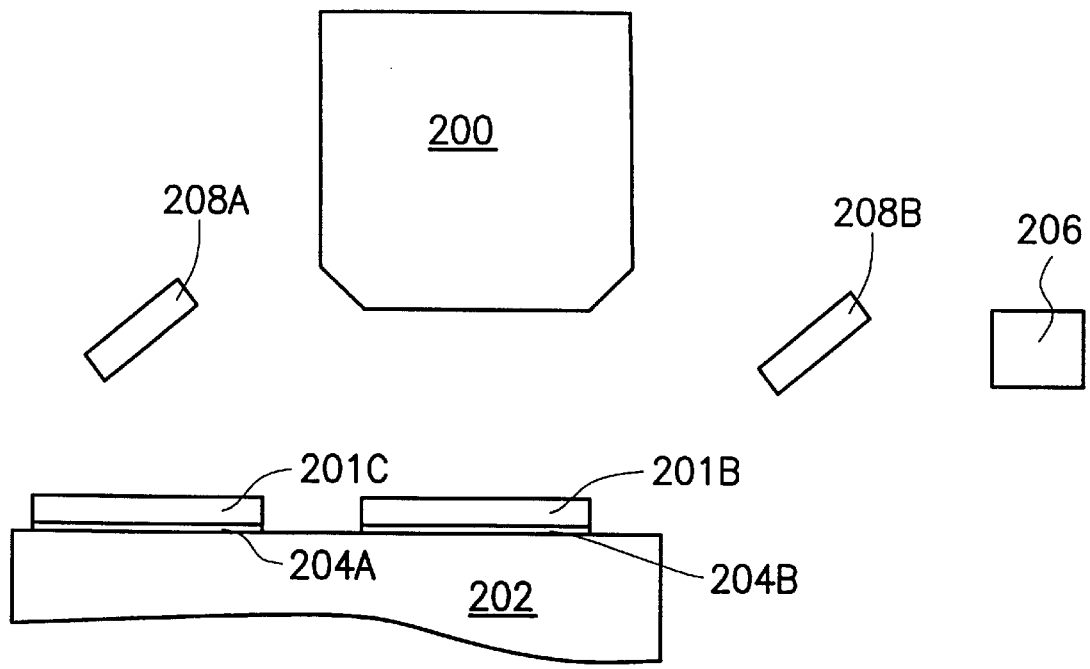

Referring next to FIG. 2B, since the wafer 201A is well aligned, the exposure of the invention starts to perform an exposing process to transfer a pre-determined pattern onto the wafer 201A. In the mean time, the exposure of the invention is also proceeding an alignment process on the wafer 201B synchronously. As shown FIG. 2B, at least two alignment beams 203 emitted from the alignment beam scan unit 206 are reflected by the mirror set 208B, and then the reflected alignment beams 203B strike on the wafer 201B from different directions. By adjusting the position of the alignment beams scan unit 206 while holding the wafer-supporting unit 202 still, the reflected alignment beams 203B scan over the top surface of the wafer 201B to align the wafer 201B. Once the reflected alignment beams 203B strike on the alignment marks, that is, the alignment information of the wafer 201B is found, expected interference patterns are formed and detected by the interferometer of the alignment unit. The position of the alignment beam scan unit is the recorded as a part of the alignment information of the wafer 201B. Because copies of the desired pattern are objects to be formed on the surface of the wafer 201B, the wafer-supporting unit 202 or the exposing unit 200 has to track along a uniquely pre-determined path and to repeat same exposing act several times. By referring to the forgoing information of the tracking path of the wafer supporting unit 202 and the position of the alignment beam scan unit 206, the alignment information of the wafer 201B is defined. The alignment beams 203 from the alignment beam scan unit 206 do not pass the center of a space below the exposing unit 200 during an exposing process is being performed. Since the alignment beams 203 don't overlap and interlace with the exposing ray from the exposing unit 200 by the presence of the mirror set 208A and 208B, a so-called off-axis system, the exposing process performed on the wafer 201A is not interrupted.

Referring to FIG, 2C, the wafer 201B is located right under the exposing unit 200 by adjusting the wafer-supporting unit 202 after the exposing process performed on the wafer 201A and the alignment process performed on the wafer 201B are both accomplished. Then, by referring to the recorded alignment information of the wafer 201B, the wafer-supporting unit 202 is then precisely adjusted to set the wafer 201B on the correct position. In the mean time, the patterned wafer 201A is unloaded from the wafer pad 204A, and another wafer 201C to be processed is loaded back on the wafer pad 204A. Because the adjusting scales of the alignment beam scan unit 206 and the wafer-supporting unit 202 are exactly the same, the alignment information obtained by the alignment beam unit 206 is easily converted and used on adjusting the wafer-supporting unit 202.

Figure 2D:
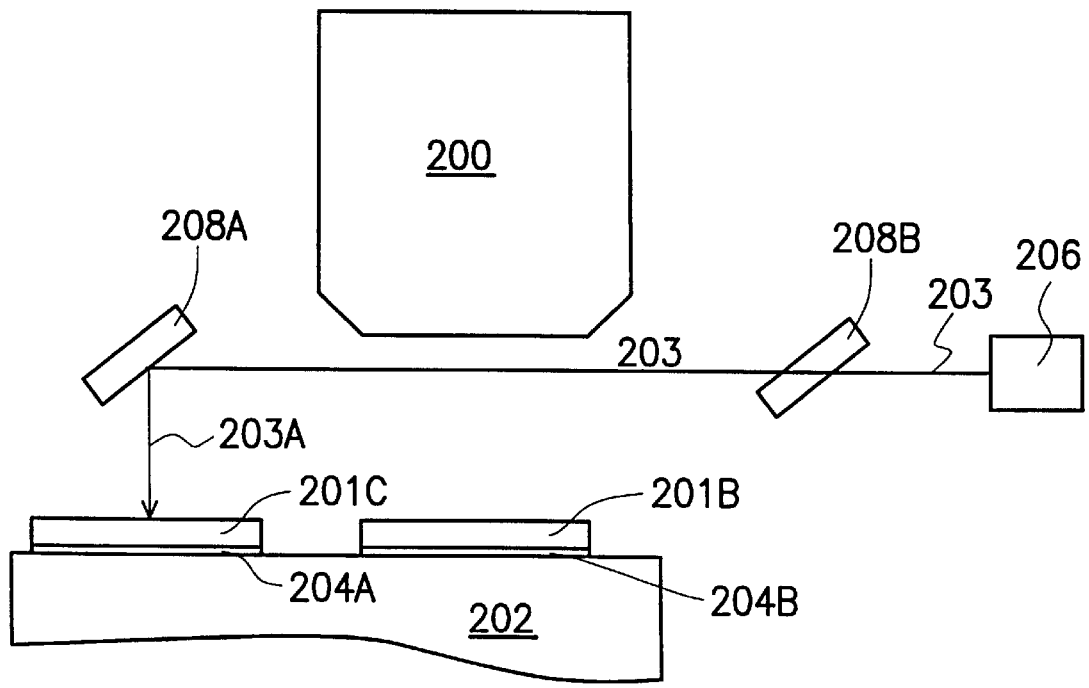

Referring next to FIG. 2D, similar to the forgoing process, a repeated exposing is performed on the wafer 201B, which is well aligned. In the mean time, an alignment process is performed on the wafer 201C by using the alignment beam scan unit 206 and the mirror set 208A. Because the exposure of the invention is an off-axis system, the alignment beams 203 don't overlap and interlace with the exposing light beam from the exposing unit 200 to the wafer. Hence, the exposing process is not interrupted by the alignment process, that is, the two process are able to be performed synchronously.

Figure 2E:
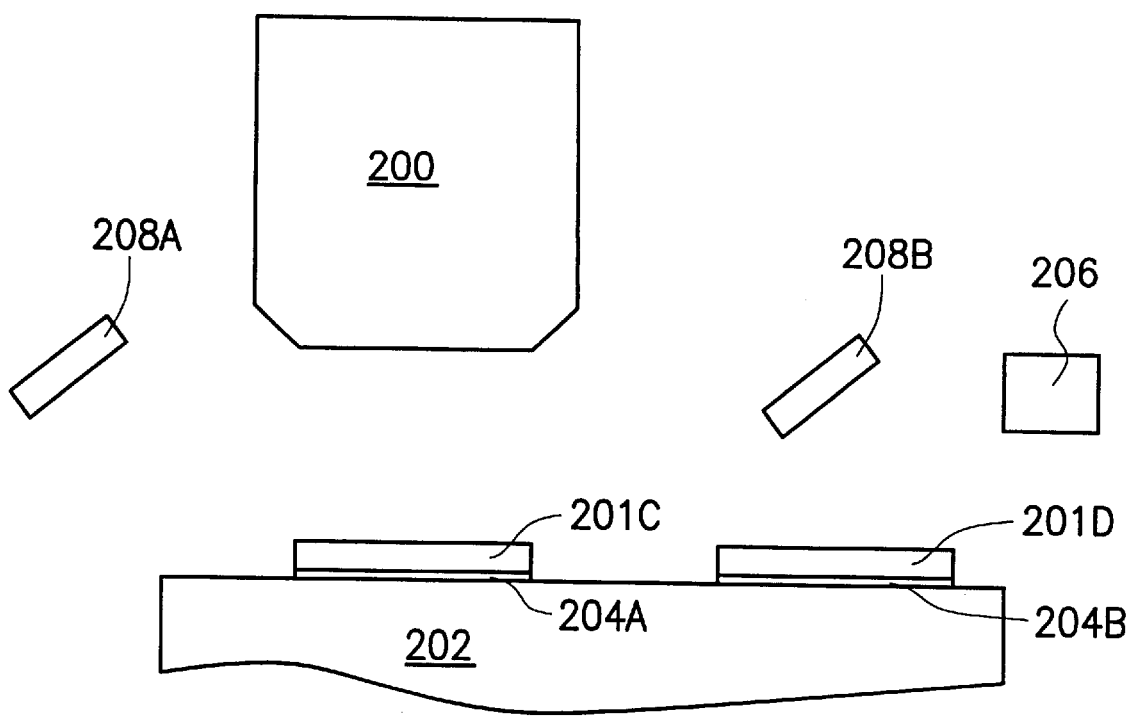

Referring next to FIG. 2E, the wafer 20C is now located right under the exposing unit 200 by adjusting the wafer-supporting unit 202 after the exposing process performed on the wafer 201B and the alignment process performed on the wafer 201C are both accomplished. Similar to the foregoing, after unloading the exposed wafer and reloading the wafer to be processed, the exposure of the invention keeps working on the exposing process and the alignment process on two different wafers synchronously.

According to the foregoing, the exposure of the invention performs the exposing process and alignment process synchronously on two different wafers placed on the wafer-supporting unit 202. Because the exposure of the invention is an off-axis system, that is, the alignment beams 203 don't overlap and interlace with the exposing beam in the presence of the mirror sets 208A and 208B, two process can be performed synchronously without interference.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A exposure for performing a synchronized off-axis alignment process, the exposure comprising:

a wafer-supporting unit, wherein the wafer-supporting unit comprises a first wafer pad for holding a first wafer, and a second wafer pad for holding a second wafer;

an exposing unit above the wafer-supporting unit, for transferring a pattern on to one selected form the group consisting of the wafer and the second wafer; and an alignment unit on the side of the wafer-supporting unit for obtaining an alignment information, wherein the alignment unit consists of a alignment beam scan unit, a interferometer and a first mirror set and a second mirror set.

2. The exposure for performing a synchronized off-axis alignment process of claim 1, wherein the alignment process comprising the steps of:

placing the first wafer on the first wafer pad;

scanning the first wafer by using the alignment unit to obtain a first alignment information;

moving the wafer-supporting unit to locate the first wafer under the exposing unit, and defining the position of the first wafer by referring to the first alignment information;

loading the second wafer on the second wafer pad;

performing an exposing process on the first wafer and synchronously performing an alignment process on the second wafer to obtain a second alignment information;

moving the wafer-supporting unit to locate the second wafer under the exposing unit, and defining the position of the second wafer by referring to the second alignment information;

unloading the first wafer from the first wafer pad, and loading a third wafer on the first wafer pad;

performing an exposing process on the second wafer and synchronously performing an alignment process on the third wafer to obtain a third alignment information;

moving the wafer-supporting unit to locate the third wafer under the exposing unit, and defining the position of the third wafer by referring to the third alignment information;

unloading the second wafer from the second wafer pad, and loading a fourth wafer on the second wafer pad; and repeatedly performing the foregoing steps in sequence on wafers placed on the first wafer pad and the second wafer pad.

3. The exposure for performing a synchronized off-axis alignment process of claim 2, wherein the alignment beam scan unit is adjustable.

4. The exposure for performing a synchronized off-axis alignment process of claim 2, wherein the alignment beam scan unit and the wafer-supporting unit are in a same adjusting scale.

5. The exposure for performing a synchronized off-axis alignment process of claim 2, wherein the wafer-supporting unit remains still while an exposing process is being performed.

6. The exposure for performing a synchronized off-axis alignment process of claim 2, wherein the wafer-supporting unit tracks along a pre-determined path while an exposing process is being performed.

7. The exposure for performing a synchronized off-axis alignment process of claim 6, wherein the alignment beam scan unit is adjusted to obtain a alignment information of a corresponding wafer.

8. The exposure for performing a synchronized off-axis alignment process of claim 1, wherein the alignment beam scan unit emits at least two alignment beams for obtaining the alignment information.

9. The exposure for performing a synchronized off-axis alignment process of claim 8, wherein the at least two alignment beams comprises a first alignment beam for scanning a first part of the alignment information of a first direction.

10. The exposure for performing a synchronized off-axis alignment process of claim 8, wherein the at least two alignment beams comprises a second alignment beam for scanning a second part of the alignment information on a second direction.

11. The exposure for performing a synchronized off-axis alignment process of claim 8, wherein the at least alignment beams do not pass a right center of a space below the exposing unit.

* * * * *